United States Patent
Bailey et al.

(10) Patent No.: US 7,995,490 B2
(45) Date of Patent: Aug. 9, 2011

(54) SYSTEM AND METHOD FOR IDENTIFYING A SIGNATURE OF A DEVICE, IN A COMMUNICATION CIRCUIT, UTILIZING DISTORTION PRODUCTS

(75) Inventors: George R. Bailey, Gaitersburg, MD (US); Terry Zhou, Germantown, MD (US)

(73) Assignee: Spirent Communications, Inc., Sunnyvale, CA (US)

( * ) Notice: Subject to any disclaimer, the term of this patent is extended or adjusted under 35 U.S.C. 154(b) by 1951 days.

(21) Appl. No.: 10/878,696

(22) Filed: Jun. 29, 2004

(65) Prior Publication Data
US 2005/0286429 A1    Dec. 29, 2005

(51) Int. Cl.
H04L 1/00       (2006.01)
H03M 13/00    (2006.01)
H03F 1/26       (2006.01)
(52) U.S. Cl. ............... 370/252; 714/774; 330/149
(58) Field of Classification Search .............. None
See application file for complete search history.

(56) References Cited

U.S. PATENT DOCUMENTS

| | | | |
|---|---|---|---|
| 4,373,121 A | 2/1983 | Sartori et al. | |
| 4,415,779 A | 11/1983 | Bowman | |
| 4,529,847 A | 7/1985 | DeBalko | |
| 4,543,524 A | 9/1985 | Bulley | |
| 5,023,565 A * | 6/1991 | Lieu | .............. 330/151 |
| 5,353,327 A | 10/1994 | Adari et al. | |
| 5,357,556 A | 10/1994 | Dresser | |
| 5,465,287 A | 11/1995 | Egozi | |
| 5,598,455 A | 1/1997 | Bliven et al. | |
| 5,649,304 A | 7/1997 | Cabot | |
| 6,061,161 A * | 5/2000 | Yang et al. | .............. 398/194 |
| 6,144,721 A | 11/2000 | Stephens | |
| 6,163,259 A | 12/2000 | Barsumian et al. | |
| 6,212,258 B1 | 4/2001 | Bella et al. | |
| 6,343,114 B1 | 1/2002 | Chea, Jr. | |
| 6,453,016 B1 | 9/2002 | Chea, Jr. | |
| 6,456,650 B1 | 9/2002 | Cheng et al. | |
| 6,504,692 B1 | 1/2003 | Macbeth et al. | |
| 6,535,580 B1 | 3/2003 | Strauss et al. | |
| 6,559,654 B2 | 5/2003 | Ho et al. | |

(Continued)

OTHER PUBLICATIONS

Agilent PSA performance Spectrum Analyzer Series, Optimizing Dynamic Range for Distortion Measurements, Product Note, Nov. 28, 2000.*

Primary Examiner — Jianye Wu
(74) Attorney, Agent, or Firm — Haynes Beffel & Wolfeld LLP; Ernest J. Beffel, Jr.

(57) ABSTRACT

A system for identifying characteristics of communication circuit devices in a communication circuit includes a stimulus signal generator configured to generate a stimulus signal at a plurality of amplitudes for the communication circuit devices. At least one of the plurality of amplitudes exceeds a first predetermined threshold. At least one communication circuit device is configured to generate a signature signal in response to the stimulus signal when the stimulus signal exceeds the first predetermined threshold. The system includes an evaluation device configured to evaluate at least one intermodulation distortion (IMD) product of the signature signal generated by the at least one communication circuit device, and to identify a class of the at least one communication circuit device according to a transition level of an amplitude of the at least one IMD product of the signature signal that exceeds a second predetermined threshold.

16 Claims, 7 Drawing Sheets

U.S. PATENT DOCUMENTS

| | | |
|---|---|---|
| 6,563,867 B2 | 5/2003 | Gazsi |
| 2001/0054974 A1* | 12/2001 | Wright .......................... 341/144 |
| 2002/0180458 A1 | 12/2002 | Ho et al. |
| 2003/0187636 A1 | 10/2003 | Klippel et al. |
| 2004/0003332 A1* | 1/2004 | Kim et al. ...................... 714/744 |
| 2004/0070449 A1* | 4/2004 | Pekonen et al. .............. 330/149 |
| 2004/0095995 A1 | 5/2004 | Matreci et al. |
| 2004/0156644 A1* | 8/2004 | Yasue et al. ................... 398/198 |

* cited by examiner

SYSTEM AND METHOD FOR IDENTIFYING A SIGNATURE OF A DEVICE, IN A COMMUNICATION CIRCUIT, UTILIZING DISTORTION PRODUCTS

BACKGROUND

1. Field of the Invention

The present invention relates to information communication system testing. More particularly, the present invention relates to a system and method for identifying a signature of a device, in a communication circuit, utilizing distortion products.

2. Background Information

The presence of Local Exchange Carrier (LEC) telecom wire line devices deployed as Customer Premises Equipment (CPE) or Central Office (CO) equipment can be difficult to distinguish electrically from the characteristics of another loop which is totally unterminated, when such devices are installed on a typical twisted pair loop. Such devices can include, for example, CPE splitters for separating a Digital Subscriber Loop (DSL) service from a Plain Old Telephone Service (POTS) delivered on the same loop pair, CO splitters, Integrated Services Digital Network (ISDN) modems, Maintenance Termination Units (MTUs) and the like. These and other like devices can be fitted with an electrical signature that is elicited by stimulus outside of the range of encountered conditions associated with the type of service commissioned for the subject loop, so that their presence or absence can more readily be determined without physical examination. For example, signatures associated with CO devices can display asymmetric voltage verses current (EI) curves about the origin, appearing electrically absent under the polarity and range of normal POTS voltages. However, these devices can display an identifying characteristic curve slope and inflection point or points under the influence of reverse polarity voltages. This class of signatures can be identified by recording loop direct current (DC) in response to a selected variety of applied DC loop voltages.

In contrast, for the class of devices utilized as CPE, an Alternating Current (AC) signature EI curve is generally utilized that is symmetric about the origin, yet appearing electrically absent until some characteristic minimum, polarity independent, loop voltage is reached. At or beyond this polarity independent applied voltage, a characteristic additional impedance is impressed upon the subject loop. The symmetric operation is necessary as the certainty that the individual leads (the so-called Tip and Ring leads) comprising the subject telecom pair are labeled consistently from CO to CPE is poor. Under such conditions, an asymmetric signature could be missed if the pair leads were reversed, or the signature could be elicited by normal loop working conditions and consequently interfere with normal operation. Thus, since normal POTS loop working conditions can include a large DC voltage for the purposes of power and supervision (e.g., on and off hook, and dialing) for POTS telephones, and since the Tip and Ring lead orientation is uncertain at the CPE, any DC-dependent signature component is inappropriate.

Conventionally, to identify this class of signatures, a sinusoidal AC signal with peak values below the characteristic minimum turn on value is applied. The resultant AC impedance of the circuit pair is then measured without the influence of the signature. Next, a sinusoidal AC signal with peak values substantially in excess (e.g., three or more times) of the turn-on threshold voltage is applied, so that the signature impedance appears in combination with the normal circuit pair impedance. The expected change in measured total impedance can be calculated and used as a criterion for decision of presence or absence. Unfortunately, for long loops, and especially long loops that have certain CPE connected that possess significant capacitance, the change in observed impedance in response to a large AC stimulus may be sufficiently small so as to fall within the accuracy window of the measuring instrument, thus making the judgment of signature presence or absence uncertain.

SUMMARY OF THE INVENTION

A system and method are disclosed for identifying a signature of a communication circuit device, in a communication circuit, utilizing distortion products created by the communication circuit device in response to a predetermined stimulus signal. In accordance with exemplary embodiments, according to a first aspect of the present invention, a system for identifying characteristics of communication circuit devices in a communication circuit includes a stimulus signal generator. The stimulus signal generator is configured to generate a stimulus signal at a plurality of amplitudes for the communication circuit devices. At least one of the plurality of amplitudes exceeds a first predetermined threshold. At least one of the communication circuit devices is configured to generate a signature signal in response to the stimulus signal when the stimulus signal exceeds the first predetermined threshold. The system includes an evaluation device. The evaluation device is configured to evaluate at least one intermodulation distortion product of the signature signal generated by the at least one communication circuit device. The evaluation device is configured to identify a class of the at least one communication circuit device according to a transition level of an amplitude of the at least one intermodulation distortion product of the signature signal that exceeds a second predetermined threshold.

According to the first aspect, the evaluation device can be configured to detect the presence of the at least one communication circuit device. The evaluation device can be configured to verify the identification of the class of the at least one communication circuit device using the amplitude of the at least one intermodulation distortion product of the received signature signal that exceeds the second predetermined threshold. According to an exemplary embodiment of the first aspect, the stimulus signal can comprise a single frequency signal. According to an alternative exemplary embodiment, the stimulus signal can comprise at least two frequency signals. The amplitude of each of the at least two frequency signals can be different. The phase of each of the at least two frequency signals can be different. The at least one intermodulation distortion product of the signature signal can comprise, for example, a third-order harmonic of at least one component of the stimulus signal. The at least one communication circuit device can comprise at least one signature element. The at least one signature element can be configured to generate the signature signal in response to the stimulus signal when the stimulus signal exceeds the first predetermined threshold. According to an exemplary embodiment of the first aspect, the at least one communication circuit device can comprise Customer Premises Equipment, a Maintenance Termination Unit or the like.

According to a second aspect of the present invention, a system for evaluating a communication circuit includes a plurality of communication circuit devices of the communication circuit. Each communication circuit device is configured to receive a stimulus signal at a plurality of amplitudes. At least one of the plurality of amplitudes exceeds a first predetermined threshold. At least one of the plurality of communication circuit devices is configured to generate a signature signal in response to the stimulus signal when the stimulus signal exceeds the first predetermined threshold. The system includes an evaluation device. The evaluation device is configured to evaluate at least one intermodulation distortion product of the signature signal generated by the at least one communication circuit device. The evaluation device is also configured to classify the at least one communication circuit device according to a transition level of an amplitude of the at least one intermodulation distortion product of the signature signal that exceeds a second predetermined threshold.

According to the second aspect, the evaluation device can be configured to detect the presence of the at least one communication circuit device. The evaluation device can be configured to verify the classification of the at least one communication circuit device using the amplitude of the at least one intermodulation distortion product of the signature signal that exceeds the second predetermined threshold. According to an exemplary embodiment of the second aspect, the stimulus signal can comprise a single frequency signal. According to an alternative exemplary embodiment, the stimulus signal can comprise at least two frequency signals. The amplitude of each of the at least two frequency signals can be different. The phase of each of the at least two frequency signals can be different. The at least one intermodulation distortion product of the signature signal can comprise, for example, a third-order harmonic of at least one component of the stimulus signal. The at least one communication circuit device can include at least one signature element. The at least one signature element can be configured to generate the signature signal in response to the stimulus signal when the stimulus signal exceeds the first predetermined threshold. According to an exemplary embodiment of the second aspect, the at least one communication circuit device can comprise Customer Premises Equipment, a Maintenance Termination Unit or the like.

According to a third aspect of the present invention, a system for evaluating a communication circuit includes a stimulus signal generator. The stimulus signal generator is configured to generate a stimulus signal at a plurality of amplitudes. At least one of the plurality of amplitudes exceeds a first predetermined threshold. The system includes a plurality of communication circuit devices of the communication circuit. Each communication circuit device is configured to receive the stimulus signal. At least one of the plurality of communication circuit devices is configured to generate a respective signature signal in response to the stimulus signal when the stimulus signal exceeds the first predetermined threshold. The system includes an evaluation device. The evaluation device is configured to detect the presence of the at least one communication circuit device. The evaluation device is configured to evaluate at least one intermodulation distortion product of the respective signature signal generated by the at least one communication circuit device. The evaluation device is configured to identify a class of the at least one communication circuit device according to a transition level of an amplitude of the at least one intermodulation distortion product of the respective signature signal that exceeds a second predetermined threshold. The evaluation device is configured to verify the identification of the class of the at least one communication circuit device using the amplitude of the at least one intermodulation distortion product of the respective signature signal that exceeds the second predetermined threshold.

According to a fourth aspect of the present invention, a method of identifying characteristics of communication circuit devices in a communication circuit includes the steps of: i.) transmitting a stimulus signal to the communication circuit devices at a plurality of amplitudes, wherein at least one of the plurality of amplitudes exceeds a first predetermined threshold; ii.) receiving a signature signal from at least one communication circuit device in response to the stimulus signal, wherein the at least one communication circuit device is configured to generate the signature signal in response to the stimulus signal when the stimulus signal exceeds the first predetermined threshold; iii.) evaluating at least one intermodulation distortion product of the signature signal; and iv.) identifying a class of the at least one communication circuit device according to a transition level of an amplitude of the at least one intermodulation distortion product of the signature signal that exceeds a second predetermined threshold.

According to the fourth aspect, the method can include the steps of: v.) detecting the presence of the at least one communication circuit device; and vi.) verifying the identification of the class of the at least one communication circuit device using the amplitude of the at least one intermodulation distortion product of the signature signal that exceeds the second predetermined threshold. According to an exemplary embodiment of the fourth aspect, the stimulus signal can comprise a single frequency signal. According to an alternative exemplary embodiment, the stimulus signal can comprise at least two frequency signals. The amplitude of each of the at least two frequency signals can be different. The phase of each of the at least two frequency signals can be different. The at least one intermodulation distortion product of the signature signal can comprise, for example, a third-order harmonic of at least one component of the stimulus signal. The at least one communication circuit device can include at least one signature element. The at least one signature element can generate the signature signal in response to the stimulus signal when the stimulus signal exceeds the first predetermined threshold. According to an exemplary embodiment of the fourth aspect, the at least one communication circuit device can comprise Customer Premises Equipment, a Maintenance Termination Unit or the like.

According to a fifth aspect of the present invention, a method of evaluating a communication circuit includes the steps of: i.) receiving a stimulus signal at a plurality of amplitudes by a plurality of communication circuit devices of the communication circuit, wherein at least one of the plurality of amplitudes exceeds a first predetermined threshold; ii.) generating a respective signature signal by at least one communication circuit device in response to the stimulus signal, wherein the at least one communication circuit device is configured to generate the respective signature signal in response to the stimulus signal when the stimulus signal exceeds the first predetermined threshold; iii.) determining at least one intermodulation distortion product of the respective signature signal; and iv.) classifying the at least one communication circuit device according to a transition level of an amplitude of the at least one intermodulation distortion product of the respective signature signal that exceeds a second predetermined threshold.

According to the fifth aspect, the method can include the steps of: v.) detecting the presence of the at least one communication circuit device; and vi.) verifying the classification of the at least one communication circuit device using the amplitude of the at least one intermodulation distortion product of the respective signature signal that exceeds the second predetermined threshold. According to an exemplary embodiment of the fifth aspect, the stimulus signal can comprise a single frequency signal. According to an alternative exemplary embodiment, the stimulus signal can comprise at least two frequency signals. The amplitude of each of the at least two frequency signals can be different. The phase of each of the at least two frequency signals can be different. The at least one intermodulation distortion product of the signature signal can comprise, for example, a third-order harmonic of at least one component of the stimulus signal. The at least one communication circuit device can include at least one signature element. The at least one signature element can generate the signature signal in response to the stimulus signal when the stimulus signal exceeds the first predetermined threshold. According to an exemplary embodiment of the fifth aspect, the at least one communication circuit device can comprise Customer Premises Equipment, a Maintenance Termination Unit or the like.

According to a sixth aspect of the present invention, a method of evaluating a communication circuit includes the steps of: i.) transmitting a stimulus signal to a plurality of communication circuit devices at a plurality of amplitudes, wherein at least one of the plurality of amplitudes exceeds a first predetermined threshold; ii.) generating a respective signature signal by at least one communication circuit device in response to the stimulus signal, wherein the at least one communication circuit device is configured to generate the respective signature signal in response to the stimulus signal when the stimulus signal exceeds the first predetermined threshold; iii.) receiving the respective signature signal from the at least one communication circuit device in response to the stimulus signal; iv.) detecting a presence of the at least one communication circuit device; v.) evaluating at least one intermodulation distortion product of the respective signature signal; vi.) identifying a class of the at least one communication circuit device according to a transition level of an amplitude of the at least one intermodulation distortion product of the respective signature signal that exceeds a second predetermined threshold; and vii.) verifying the identification of the class of the at least one communication circuit device using the amplitude of the at least one intermodulation distortion product of the respective signature signal that exceeds the second predetermined threshold.

According to a seventh aspect of the present invention, a system for identifying characteristics of communication circuit device means in a communication circuit means includes means for generating a stimulus signal at a plurality of amplitudes for the communication circuit device means. At least one of the plurality of amplitudes exceeds a first predetermined threshold. At least one of the communication circuit device means is configured to generate a signature signal in response to the stimulus signal when the stimulus signal exceeds the first predetermined threshold. The system includes means for evaluating at least one intermodulation distortion product of the signature signal generated by the at least one communication circuit device means. The means for evaluating is configured to identify a class of the at least one communication circuit device means according to a transition level of an amplitude of the at least one intermodulation distortion product of the signature signal that exceeds a second predetermined threshold.

According to the seventh aspect, the means for evaluating can be configured to detect the presence of the at least one communication circuit device means. The means for evaluating can be configured to verify the identification of the class of the at least one communication circuit device means using the amplitude of the at least one intermodulation distortion product of the received signature signal that exceeds the second predetermined threshold. According to an exemplary embodiment of the seventh aspect, the stimulus signal can comprise a single frequency signal. According to an alternative exemplary embodiment, the stimulus signal can comprise at least two frequency signals. The amplitude of each of the at least two frequency signals can be different. The phase of each of the at least two frequency signals can be different. The at least one intermodulation distortion product of the signature signal can comprise, for example, a third-order harmonic of at least one component of the stimulus signal. The at least one communication circuit device can comprise at least one non-linear signature means for generating the signature signal in response to the stimulus signal when the stimulus signal exceeds the first predetermined threshold.

According to an eighth aspect of the present invention, a system for evaluating a communication circuit means includes a plurality of communication circuit device means of the communication circuit means. Each communication circuit device means is configured to receive a stimulus signal at a plurality of amplitudes. At least one of the plurality of amplitudes exceeds a first predetermined threshold. At least one of the plurality of communication circuit device means is configured to generate a respective signature signal in response to the stimulus signal when the stimulus signal exceeds the first predetermined threshold. The system includes means for evaluating at least one intermodulation distortion product of the respective signature signal generated by the at least one communication circuit device means. The means for evaluating is configured to classify the at least one communication circuit device means according to a transition level of an amplitude of the at least one intermodulation distortion product of the respective signature signal that exceeds a second predetermined threshold.

According to the eighth aspect, the means for evaluating can be configured to detect the presence of the at least one communication circuit device means. The means for evaluating can be configured to verify the classification of the at least one communication circuit device means using the amplitude of the at least one intermodulation distortion product of the respective signature signal that exceeds the second predetermined threshold. According to an exemplary embodiment of the eighth aspect, the stimulus signal can comprise a single frequency signal. According to an alternative exemplary embodiment, the stimulus signal can comprise at least two frequency signals. The amplitude of each of the at least two frequency signals can be different. The phase of each of the at least two frequency signals can be different. The at least one intermodulation distortion product of the signature signal can comprise, for example, a third-order harmonic of at least one component of the stimulus signal. The at least one communication circuit device means can comprise at least one non-linear signature means for generating the respective signature signal in response to the stimulus signal when the stimulus signal exceeds the first predetermined threshold.

According to a ninth aspect of the present invention, a system for evaluating a communication circuit means includes means for generating a stimulus signal at a plurality of amplitudes. At least one of the plurality of amplitudes exceeds a first predetermined threshold. The system includes a plurality of communication circuit device means of the communication circuit means. Each communication circuit device means is configured to receive the stimulus signal. At least one of the plurality of communication circuit device means is configured to generate a respective signature signal in response to the stimulus signal when the stimulus signal exceeds the first predetermined threshold. The system includes means for evaluating at least one intermodulation distortion product of the respective signature signal generated by the at least one communication circuit device. The means for evaluating is configured to detect the presence of the at least one communication circuit device means. The means for evaluating is configured to identify a class of the at least one communication circuit device means according to a transition level of an amplitude of the at least one intermodulation distortion product of the respective signature signal that exceeds a second predetermined threshold. The means for evaluating is configured to verify the identification of the class of the at least one communication circuit device means using the amplitude of the at least one intermodulation distortion product of the respective signature signal that exceeds the second predetermined threshold.

According to a tenth aspect of the present invention, a system for identifying characteristics of communication circuit device means in a communication circuit means includes means for transmitting a stimulus signal to the communication circuit device means at a plurality of amplitudes. At least one of the plurality of amplitudes exceeds a first predetermined threshold. The system includes means for receiving a signature signal from at least one of the communication circuit device means in response to the stimulus signal. The at least one communication circuit device means is configured to generate the signature signal in response to the stimulus signal when the stimulus signal exceeds the first predetermined threshold. The system includes means for evaluating at least one intermodulation distortion product of the signature signal. The system also includes means for identifying a class of the at least one communication circuit device means according to a transition level of an amplitude of the at least one intermodulation distortion product of the signature signal that exceeds a second predetermined threshold.

According to the tenth aspect, the system can include means for detecting the presence of the at least one communication circuit device means. The system can also include means for verifying the identification of the class of the at least one communication circuit device means using the amplitude of the at least one intermodulation distortion product of the signature signal that exceeds the second predetermined threshold. According to an exemplary embodiment of the tenth aspect, the stimulus signal can comprise a single frequency signal. According to an alternative exemplary embodiment, the stimulus signal can comprise at least two frequency signals. The amplitude of each of the at least two frequency signals can be different. The phase of each of the at least two frequency signals can be different. The at least one intermodulation distortion product of the signature signal can comprise, for example, a third-order harmonic of at least one component of the stimulus signal. The at least one communication circuit device means can comprise at least one non-linear signature means for generating the signature signal in response to the stimulus signal when the stimulus signal exceeds the first predetermined threshold.

According to an eleventh aspect of the present invention, a system for evaluating a communication circuit means includes means for receiving a stimulus signal at a plurality of amplitudes by at least one communication circuit device means of the communication circuit means. At least one of the plurality of amplitudes exceeds a first predetermined threshold. The system includes means for generating a respective signature signal by the at least one communication circuit device means in response to the stimulus signal. The at least one communication circuit device means is configured to generate the respective signature signal in response to the stimulus signal when the stimulus signal exceeds the first predetermined threshold. The system includes means for determining at least one intermodulation distortion product of the respective signature signal. The system also includes means for classifying the at least one communication circuit device means according to a transition level of an amplitude of the at least one intermodulation distortion product of the respective signature signal that exceeds a second predetermined threshold.

According to the eleventh aspect, the system can include means for detecting the presence of the at least one communication circuit device means. The system can include means for verifying the classification of each communication circuit device means using the amplitude of the at least one intermodulation distortion product of the respective signature signal that exceeds the second predetermined threshold. According to an exemplary embodiment of the eleventh aspect, the stimulus signal can comprise a single frequency signal. According to an alternative exemplary embodiment, the stimulus signal can comprise at least two frequency signals. The amplitude of each of the at least two frequency signals can be different. The phase of each of the at least two frequency signals can be different. The at least one intermodulation distortion product of the signature signal can comprise, for example, a third-order harmonic of at least one component of the stimulus signal. The at least one communication circuit device means can comprise at least one non-linear signature means for generating the respective signature signal in response to the stimulus signal when the stimulus signal exceeds the first predetermined threshold.

According to a twelfth aspect of the present invention, a system for evaluating a communication circuit means includes means for transmitting a stimulus signal to at least one communication circuit device means at a plurality of amplitudes. At least one of the plurality of amplitudes exceeds a first predetermined threshold. The system includes means for generating a respective signature signal by the at least one communication circuit device means in response to the stimulus signal. The at least one communication circuit device means is configured to generate the respective signature signal in response to the stimulus signal when the stimulus signal exceeds the first predetermined threshold. The system includes means for receiving the respective signature signal from the at least one communication circuit device means in response to the stimulus signal. The system includes means for detecting the presence of the at least one communication circuit device means and means for evaluating at least one intermodulation distortion product of the respective signature signal. The system includes means for identifying a class of the at least one communication circuit device means according to a transition level of an amplitude of the at least one intermodulation distortion product of the respective signature signal that exceeds a second predetermined threshold. The system also includes means for verifying the identification of the class of the at least one communication circuit device means using the amplitude of the at least one intermodulation distortion product of the respective signature signal that exceeds the second predetermined threshold.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Exemplary embodiments of the present invention are directed to a system and method for identifying a signature of a communication circuit device, in a communication circuit, utilizing distortion products created by the communication circuit device in response to a predetermined stimulus signal. According to exemplary embodiments, the system includes a stimulus signal generator configured to generate a stimulus signal at a plurality of amplitudes for a plurality of communication circuit devices. At least one of the plurality of amplitudes can exceed a first predetermined threshold. At least one of the plurality of communication circuit devices is configured to generate a signature signal in response to the stimulus signal, when the stimulus signal exceeds the first predetermined threshold. The system includes an evaluation device configured to evaluate at least one Intermodulation Distortion product of the signature signal generated by the at least one communication circuit device. The evaluation device is also configured to identify, for example, the class of the at least one communication circuit device according to a transition level of an amplitude of the at least one Intermodulation Distortion product of the signature signal that exceeds a second predetermined threshold, and other like characteristics of the at least one communication circuit device.

According to exemplary embodiments, Customer Premises Equipment (CPE), Central Office (CO) equipment or other like communication circuit devices can include one or more non-linear elements in the communication circuit device. The non-linear elements generate signatures for their respective communication circuit devices that transition in impedance from electrical absence to an Alternating Current (AC) impedance at some applied instantaneous voltage. This non-linear behavior, in turn, creates distortion products from the applied stimulus. In conventional communication circuit discovery techniques, these distortion products are considered detrimental and are discarded as artifacts. However, according to exemplary embodiments of the present invention, these distortion products are exploited. The distortion products can be in the form of, for example, harmonics in the case of a single sine wave stimulus, or many Intermodulation Distortion (IMD) products in response to a simultaneously-applied multiplicity of sinusoidal stimuli. According to exemplary embodiments, identifying the signatures of the communication circuit devices using these distortion products provides an identification of the communication circuit device over a wide variety of connected CPE, and a wide range of loop length, even with peak stimulus voltages only modestly larger than the target signature threshold voltage.

Figure 1:
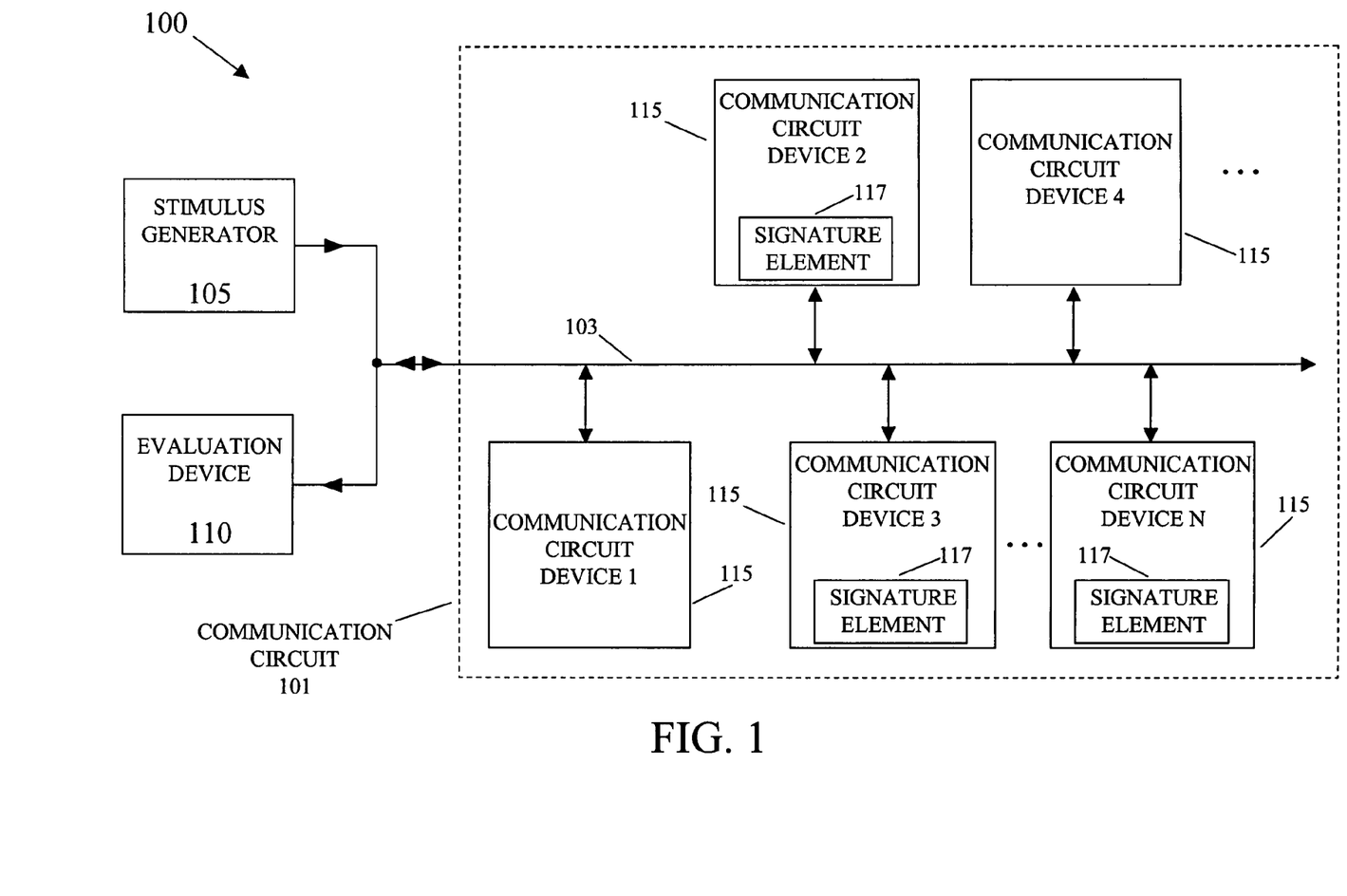
FIG. 1 is a diagram illustrating a system for identifying characteristics of a communication circuit device in a communication circuit, in accordance with an exemplary embodiment of the present invention.

These and other aspects of the present invention will now be described in greater detail. FIG. 1 is a diagram illustrating a system 100 for identifying characteristics of a communication circuit device 115 in a communication circuit 101, in accordance with an exemplary embodiment of the present invention. As used herein, a "characteristic" of a communication circuit device 115 can be any suitable characteristic of the communication circuit device 115, including, for example, whether the communication circuit device 115 is present or not within the communication circuit 101, the presence or not of a (intentional) signature element 117, the presence or not of a (unintentional) non-linearity producing a signature (e.g., diodes associated with signal rectifier means, voltage-variable capacitors or the like), the class of the communication circuit device 115, and the like. The communication circuit 101 can include a plurality of communication circuit devices 115.

The system 100 includes a stimulus signal generator 105 in communication with the communication circuit 101. The stimulus signal generator 105 is configured to generate a stimulus signal at a plurality of amplitudes for the communication circuit devices 115. At least one of the plurality of amplitudes exceeds a first predetermined threshold. However, the plurality of amplitudes can include amplitudes that are lesser than, equal to and greater than the first predetermined threshold. Intentional use of at least one stimulus signal at an amplitude less than the first predetermined threshold is desirable to ascertain the presence or absence of certain gross communication circuit impairments, such as, for example, a corroded splice, that can independently behave in a non-linear manner, and consequently produce IMD products. If any unintentional non-linearity thereby discovered is left uncorrected, the reliability with which the presence or absence of a particular communication circuit device 115 is detected may be adversely affected. At least one of the amplitudes of the stimulus signal can be selected to be less than the first predetermined threshold so that the presence, and effect, of noise or other unintentional signal sources, such as, for example, tone frequencies at multiples of power line frequencies, can be recognized and mitigated to the extent possible. For example, by judicious selection of the frequency of the stimulus signal, and consequently the specific frequencies of the IMD products produced, overlap of the IMD product frequencies to be examined and the power line harmonic frequencies can be avoided.

According to exemplary embodiments, at least one communication circuit device 115 can be configured to generate a signature signal in response to the stimulus signal when the stimulus signal exceeds the first predetermined threshold. The at least one communication circuit device 115 configured to generate such signature signals includes non-linear elements, such as signature element 117 (e.g., the second, third and Nth communication circuit devices 115 illustrated in FIG. 1). According to exemplary embodiments, the first predetermined threshold level can be the turn-on threshold voltage for the non-linearity associated with the signature element 117, i.e., the voltage level above which the communication circuit device 115 will generate a signature signal. Thus, the communication circuit device 115 can generate a signature signal when the stimulus signal is greater than or equal to the turn-on threshold voltage for the non-linearity associated with any signature element 117, intentional or unintentional, within communication circuit device 115. The stimulus signal generator 105 can generate any desired number of stimulus signals at any desired amplitude and frequency.

The system 100 includes an evaluation device 110 in communication with the communication circuit 101 and the stimulus generator 105. The evaluation device 110 is configured to evaluate at least one IMD product of the signature signal generated by the at least one communication circuit device 115. According to exemplary embodiments, the evaluation device 110 is configured to identify the class of the at least one communication circuit device 115 according to the transition level of the amplitude of the at least one IMD product of the signature signal that exceeds a second predetermined threshold. However, the evaluation device 110 can also identify other suitable characteristics of the at least one communication circuit device 115. For example, the evaluation device 110 can be configured to detect the presence of the at least one communication circuit device 115 in the communication circuit 101.

For purposes of an overview of distortion products, for example, two signals can have two different frequencies, $f_1$ and $f_2$, respectively. If the two signals are added (in which addition is a linear process) and the combination applied to a spectrum analyzer, two spectral lines will result, one at $f_1$ and one at $f_2$. If this same combined signal is applied to a communication circuit device 115 that contains a non-linearity that is excited at some level of the applied combined signal, the output of the communication circuit device 115 (i.e., the response) will appear distorted. If this output is applied to the spectrum analyzer, more distinct frequencies other than $f_1$ and $f_2$ will be observed. In general, spectral lines at all frequencies $|n*f_1+m*f_2|$ can be created, where n and m can independently be any positive or negative integer number, including zero. Any spectral line in the output other than at frequency $f_1$ and $f_2$ is a distortion product, known, as a class, as IMD products. The subset of products that are multiples of an individual sinusoidal stimulus signal are referred to as harmonic distortion products. The specific nature of the causative non-linearity and stimulus signal amplitude level will determine the relative spectral line amplitudes and how many spectral lines are observable. Given a predetermined stimulus signal, a method that searches for the absence of IMD products at one or more possible specific frequencies can be a sensitive indicator of the signature non-linearity shape and threshold. For example, the absence of all even-order IMD products in response to a symmetric stimulus of arbitrary level can indicate that the signature non-linearity is precisely symmetric in shape about the origin.

The "order" of a distortion product is $|n|+|m|$. For example, there are numerous third order products of two spectral lines: the twelve ordered pairs of (n,m) for third order products are $\{(-3,0), (3,0), (-2,1), (-2,-1), (2,1), (2,-1), (-1,-2), (-1,2), (1,2), (1,-2), (0,3), (0,-3)\}$. It should be noted that four of these third order products, for example (0,-3), are actually just the third harmonic of one or the other stimulus signal (in the case of two stimulus signals). It should also be noted that if $f_1=f_2=f$, then the distortion product frequencies are $|n*f|$, which are integer harmonics of the single frequency. The pattern continues for three or more simultaneous stimulus signals. For example, for three frequencies, the product frequencies will be $|n*f_1+m*f_2+p*f_3|$, and the order of any specific distortion product is $|n|+|m|+|p|$.

Additionally, if the non-linearity function of the at least one communication circuit device 115 is symmetric about zero, i.e., $i(v)=-i(-v)$, when a stimulus is applied that has no DC component (i.e., no zero frequency component), only odd order distortion products are generated. Otherwise, all orders can be, but are not necessarily, produced. Furthermore, even if the stimulus signal does not contain a DC component, an asymmetric non-linearity can create one as the zeroth order product. For example, according to an exemplary embodiment, by observing only this product, the possible communication circuit devices 115 can be separated into symmetric and asymmetric classes.

Thus, according to exemplary embodiments, the signature signal can be the IMD products generated by the at least one communication circuit device 115 in response to a stimulus signal(s) that has an amplitude equal to or above the minimum threshold turn-on voltage for the at least one communication circuit device 115. The IMD products can be in the form of, for example, harmonics in the case of a single sine wave stimulus, or many IMD products in response to a simultaneously-applied plurality of sine-wave stimuli. According to an exemplary embodiment of the present invention, the at least one IMD product of the signature signal can be a third-order harmonic of at least one component of the stimulus signal. However, certain asymmetric non-linear elements of the at least one communication circuit device 115 can produce characteristic second order, as well as third order, distortion products. Thus, according to an alternative exemplary embodiment, the at least one IMD product of the signature signal can comprise a zeroth, first, second, third and/or higher order IMD product of the stimulus signal.

The stimulus signal can comprise a single frequency signal. However, according to an alternative exemplary embodiment, the stimulus signal can comprise at least two frequency signals. Any suitable frequency or frequencies can be used for the stimulus signal. If the stimulus signal is comprised of two or more frequencies, the amplitude of each of the at least two frequency signals can be different. In other words, the amplitude ratio of the at least two frequency signals can be varied to maximize the signature signal generated by the communication circuit device 115. Additionally or alternatively, the phase of each of the at least two frequency signals can be different.

According to exemplary embodiments, the communication circuit 101 can include any number of communication circuit devices 115. At least one communication circuit device 115 can include at least one signature element 117. However, the communication circuit 101 can include communication circuit devices 115 that include at least one signature element 117 (e.g., the second, third and Nth communication circuit devices 115 illustrated in FIG. 1), as well as communication circuit devices 115 that do not include such a signature element 117 or other non-linear element capable of generating a signature signal (e.g., the first and fourth communication circuit devices 115 illustrated in FIG. 1). The at least one signature element 117 can include any suitable combination of non-linear and linear elements, such as capacitors, resistors, diodes or the like or any combination thereof, capable of generating a signature signal in response to an appropriate stimulus signal.

Figure 2A:
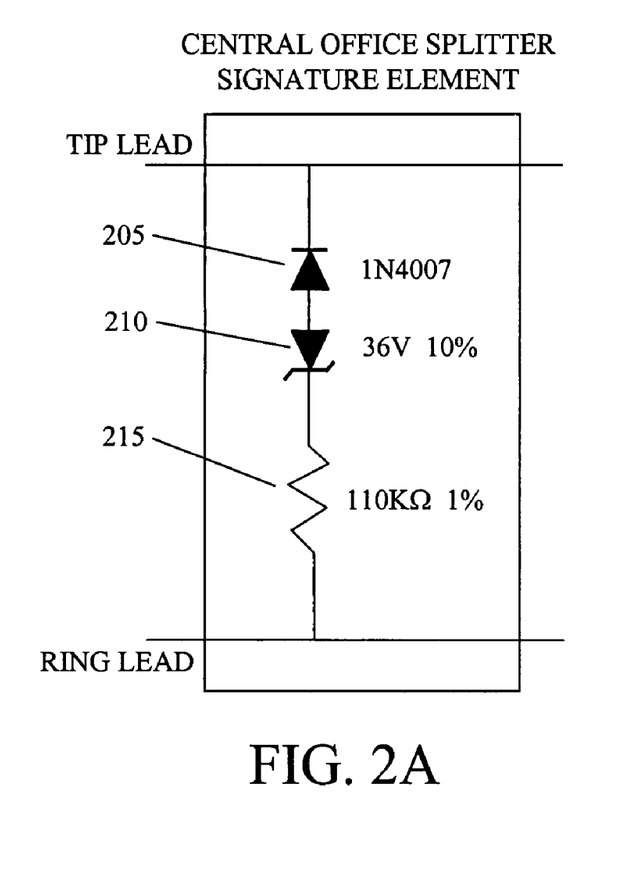
FIGS. 2A, 2B and 2C illustrate examples of signature elements that can be included in communication circuit devices, in accordance with an exemplary embodiment of the present invention.
Figure 2B:
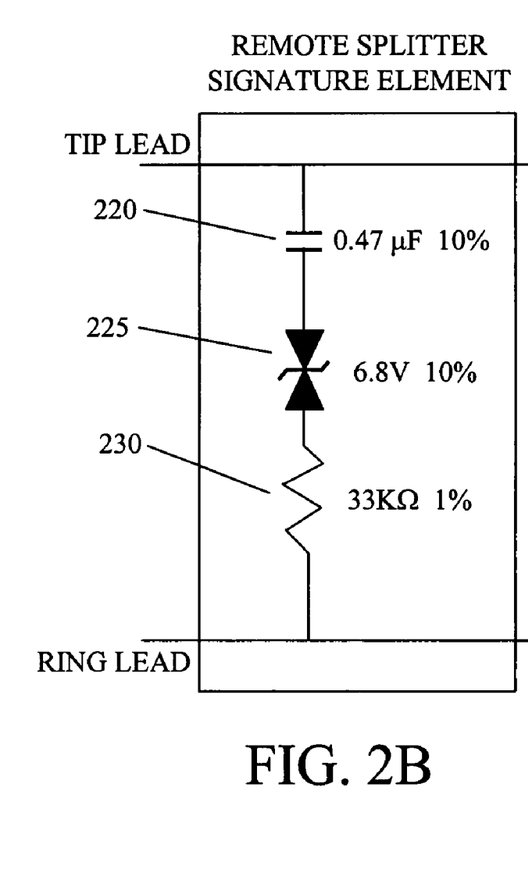

For purposes of illustration and not limitation, FIGS. 2A and 2B illustrate examples of signature elements 117 that can be included in communication circuit devices 115, in accordance with an exemplary embodiment of the present invention. For example, FIG. 2A illustrates a signature element of a CO splitter, including a diode 205, a 36 V zener diode 210 and a 110 KΩ resistor 215. FIG. 2B illustrates a signature element of a remote splitter, including a 0.47 μF capacitor 220, a 6.8 V bi-directional zener diode 225 and a 33 KΩ resistor 230. The at least one signature element 117 of the at least one communication circuit device 115 is configured to generate the signature signal in response to the stimulus signal when the stimulus signal exceeds the first predetermined threshold. For example, the CO splitter signature element illustrated in FIG. 2A can generate an asymmetric DC-coupled non-linear signature signal, whereas the remote splitter signature element illustrated in FIG. 2B can generate a symmetric AC-coupled non-linear signature signal. Conventionally, the class of communication circuit devices 115 that possess a DC-dependent signature with asymmetric response can be identified by polarity-sensitive variations in resistance, as observed using a variable DC source as a stimulus. Communication circuit devices 115 that possess a signature with symmetric non-linear response can substantially suppress the generation of second and higher even-order distortion products, and thus can be differentiated by the absence of these specific products. According to exemplary embodiments, however, characteristics of the at least one communication circuit device 115 can be determined by evaluating the at least one IMD product of the signature signal generated by those communication circuit device 115 with at least one signature element 117.

According to exemplary embodiments, the at least one communication circuit device 115 can comprise a CPE, a Maintenance Termination Unit (MTU), an electronic ringer, a CPE or CO splitter for DSL over POTS service, or any other suitable type of electrical or electronic device or component that, intentionally or not, is capable of generating a characteristic IMD product signature signal in response to a stimulus signal that is greater than or equal in amplitude to the first predetermined threshold.

For purposes of illustration and not limitation, examples of the application of the present invention to a simulated communication channel will now be described. For the frequencies and impedances of concern for the following examples, a simple line model of 0.083 µF per mile will be utilized. For a first illustration, a 0.3 µF capacitance can be used to simulate a comparatively long 19,000 foot subscriber loop pair. Subscribe loop pairs of this length can be challenging for the detection of distant communication circuit devices by conventional fundamental frequency impedance comparison methods. For this first illustration, exemplary embodiments of the present invention can be used to detect a 2.4 V MTU, such as, for example, the signature element of a MTU illustrated in FIG. 2C, comprised of a 0.47 µF capacitor 235, a 2.4 V bi-directional zener diode 240 and a 15 KΩ resistor 245. The stimulus signal can be comprised of two frequencies of equal amplitude: 103 Hz and 153 Hz. For purposes of illustration, a signature signal comprising a 53 Hz third-order harmonic of the stimulus signal can be examined (where 2*103−1*153=53 Hz). Table 1 indicates the results of the simulation.

TABLE 1

Simulation Results for 2.4 V MTU Using Two Frequency Stimulus Signal

| Peak Amplitude of Each Stimulus Component | Level of Received 53 Hz Distortion Product (Relative to Received 153 Hz Stimulus Component) |
|---|---|
| 1 V | −43.1 dB |
| 2 V | −32.4 dB |
| 3 V | −31.8 dB |
| 4 V | −32.7 dB |
| 5 V | −33.8 dB |
| 6 V | −34.7 dB |

It can be seen from Table 1 that there is a steep rise in the 53 Hz distortion product level relative to the stimulus signal level from 1 V to the (apparent) peak at 3 V, followed by a gradual and small decline from 3 V to 6 V. According to exemplary embodiments, the evaluation device 110 can identify a class of the at least one communication circuit device 115 according to a transition level of an amplitude of the at least one IMD product of the signature signal that exceeds a second predetermined threshold. According to an exemplary embodiment, the second predetermined threshold can be near the peak or maximum of the distortion level of the signature signal, such as, for example, −33 dB or any similarly suitable value. As shown in Table 1, the signature signal transitions to a maximum distortion level of −31.8 dB at 3 V. According to exemplary embodiments, such a transition and peak is indicative of a 2.4 V MTU. Thus, according to exemplary embodiments, the class of the communication circuit device 115 of the present illustration can be identified as a 2.4 V MTU.

Additionally, the evaluation device 110 can be configured to verify the identification of the class of the at least one communication circuit device 115 using the amplitude of the at least one IMD product of the received signature signal that exceeds the second predetermined threshold. As illustrated in Table 1, the maximum of the distortion level occurs at a peak amplitude of the stimulus signal of 3 V. According to exemplary embodiments, such a value is indicative of a 2.4 V MTU, thereby verifying the class of the communication circuit device 115 of the present illustration as identified using distortion products.

Exemplary embodiments of the present invention can be used to identify other characteristics of the at least one communication circuit device 115, such as, for example, whether a communication circuit device 115 with at least one signature element 117 is present in the communication circuit 101. For example, a stimulus signal can be generated by stimulus signal generator 105 at an amplitude less than the first predetermined threshold. At such levels, no signature signals are generated by communication circuit devices 115 with signature elements 117 that may be present in the communication circuit 101. The stimulus signal generator 105 can then generate a stimulus signal that exceeds the first predetermined threshold, which will cause any communication circuit devices 115 that include signature elements 117 and that may be present in the communication circuit 101 to generate a signature signal. Thus, if one or more signature signals are received by the evaluation device 110, the presence of communication circuit devices 115 with signature elements 117 in the communication circuit 101 can be detected.

For a second illustration, exemplary embodiments of the present invention can be used to detect a 2.4 V MTU using a stimulus signal comprised of a single frequency of 53 Hz. For purposes of illustration, a signature signal comprising a 159 Hz third-order harmonic of the stimulus signal can be examined (where 3*53=159 Hz). Table 2 indicates the results of the simulation.

TABLE 2

Simulation Results for 2.4 V MTU Using Single Frequency Stimulus Signal

| Peak Amplitude of Stimulus | Level of Received 159 Hz Distortion Product (Relative to Received Stimulus Fundamental) |
|---|---|
| 1 V | −53.4 dB |
| 2 V | −30.4 dB |
| 3 V | −24.7 dB |
| 4 V | −23.8 dB |
| 5 V | −23.4 dB |
| 6 V | −24.8 dB |
| 7 V | −26.1 dB |

TABLE 2-continued

Simulation Results for 2.4 V MTU
Using Single Frequency Stimulus Signal

| Peak Amplitude of Stimulus | Level of Received 159 Hz Distortion Product (Relative to Received Stimulus Fundamental) |
|---|---|
| 8 V | −26.9 dB |
| 9 V | −26.7 dB |
| 10 V | −27.1 dB |

As shown in Table 2, there is a steep rise in the 159 Hz distortion product level relative to the stimulus signal level from 1 V to 3 V, broadly peaking at a maximum distortion level of −23.4 dB at 5 V, followed by a gradual and small decline from 6 V to 10 V. According to exemplary embodiments, such a transition and peak is indicative of a 2.4 V MTU. Thus, according to exemplary embodiments, the class of the communication circuit device 115 can again be identified as a 2.4 V MTU. Additionally, the maximum of the distortion level occurs at a peak amplitude of the stimulus signal of 5 V. According to exemplary embodiments, such a value is indicative of a 2.4 V MTU, thereby verifying the class of the communication circuit device 115 of the present illustration as identified using distortion products. Thus, for the illustrations listed in Tables 1 and 2, either a single frequency or a dual frequency stimulus signal can be used for purposes of identifying characteristics of communication circuit devices 115 with signature elements 117, although any number of frequencies can be so used.

Figure 3A:
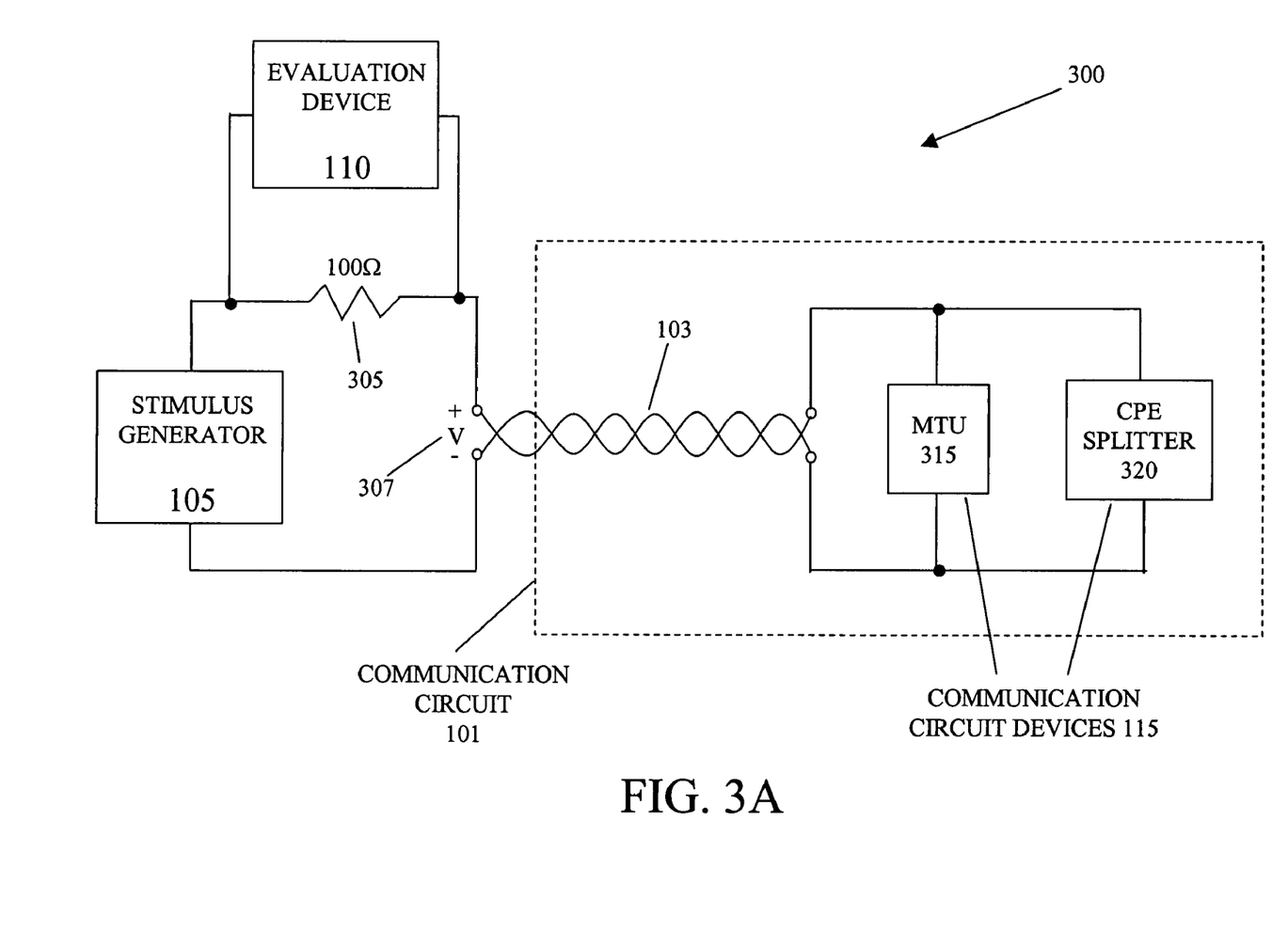
FIGS. 3A and 3B illustrate an example of multiple signature element detection, in accordance with an exemplary embodiment of the present invention.
Figure 3B:
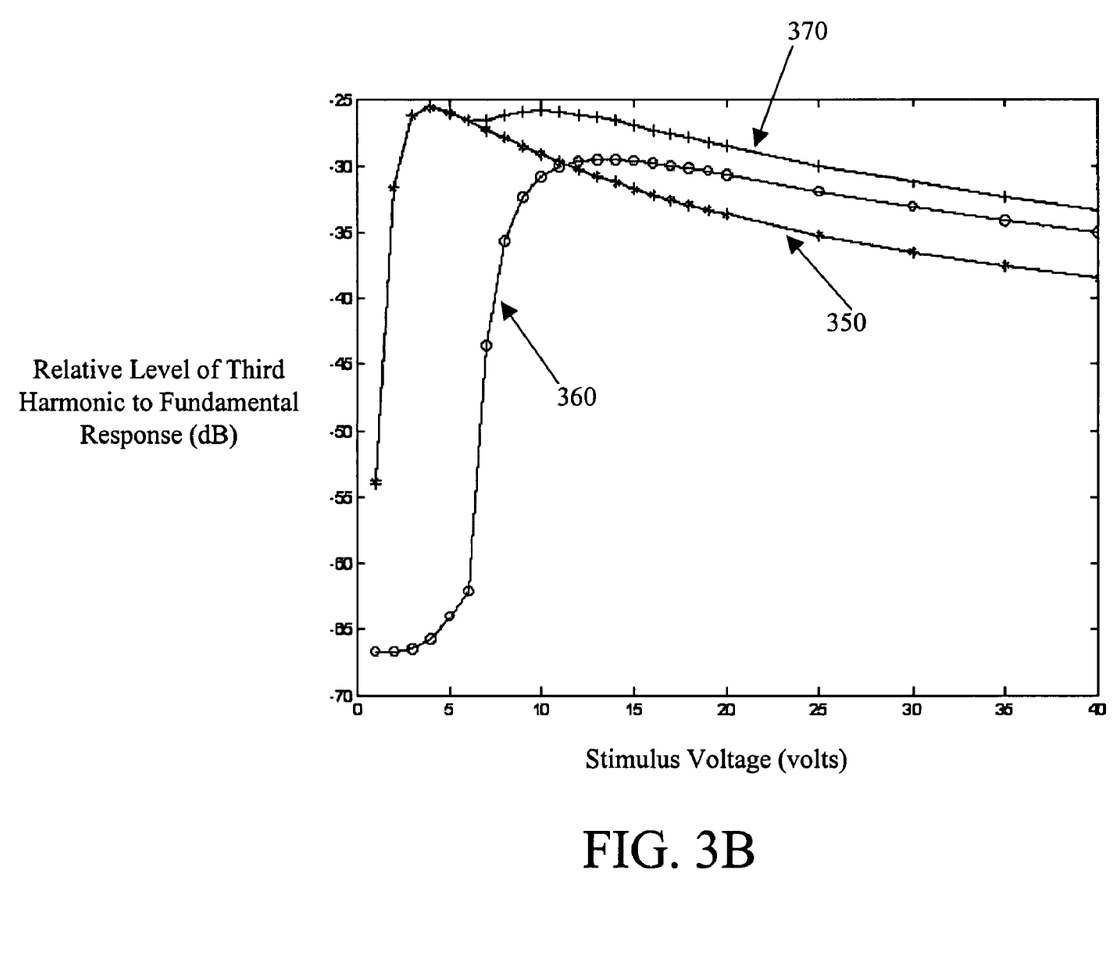

For purposes of illustration and not limitation, FIGS. 3A and 3B illustrate an example of multiple signature element detection, in accordance with an exemplary embodiment of the present invention. As illustrated in FIG. 3A, the system 300 includes the stimulus generator 105 and the evaluation device 110. For example, the evaluation device 110 can measure the response current (i.e., the voltage developed across a 100Ω resistor 305) of the signature signal(s) received from the signature elements of the communication circuit devices 115 (such as, for example, MTU 315 and CPE splitter 320) of the communication circuit 101, although measurement of a loop voltage 307 can also be performed. The communication circuit 101 can include, for example, the MTU 315 and the CPE splitter 320. As with the foregoing illustrations, a simple line model of 0.083 µF per mile will be utilized, where a 0.3 µF capacitance can be used to simulate a comparatively long 19,000 foot subscriber loop pair. A signature signal comprising a 53 Hz third-order harmonic of the stimulus signal can be examined, with applied stimulus voltages in the range of 1 V to 40 V used. The results of the present example are illustrated in FIG. 3B, which is a graph of the third harmonic distortions relative to the 0 dB fundamental reference signal verses the stimulus voltage. More particularly, a Fourier spectrum of the received signal is generated, and FIG. 3B is a plot of the difference between the third harmonic and the fundamental signal verses the applied stimulus voltages, where curve 350 represents the response for the MTU 315, curve 360 represents the response for the CPE splitter 320, and curve 370 represents the response for the combination of MTU 315 and CPE splitter 320.

As can be seen in FIG. 3B, when the stimulus voltage is smaller than the break-down voltage of the signature element, there are few, if any, relative third harmonic distortions. In addition, as the stimulus voltage increases over the break-down voltage, there is a steep rise in the relative third harmonic distortions. The starting voltage and the distortion peaks are useful in determining the break-down voltage of the signature element. The peak values can occur when the stimulus voltage is approximately one to two times the break-down voltage. For example, if another signature element is used that is the similar to, for example, the MTU 315, except with a larger break-down voltage, then a curve similar to the curve 360 for CPE splitter 320 will result, as the curve will be located to the right of the MTU curve 350. In addition, a substantially flat, low-level portion is not seen in the lowest voltage portion of MTU curve 350, because the break-down voltage of the MTU 315 is low and voltages smaller than 1 V have not been applied.

For all the three cases, as the stimulus voltage becomes substantially (e.g., two or more times) larger than the break-down voltage of the respective signature elements, the third harmonic distortion will start to decline gradually. The larger the stimulus voltage relative to the break-down voltage of the signature element, the less the distortion. Therefore, the declining portion of curve 350 for the MTU 315 is lower (i.e., smaller distortion) than that of the curve 360 for CPE splitter 360, which is lower than the curve 370 for the combined MTU 315 and CPE splitter 320. For the case of multiple signature elements, the signature element with the smaller break down voltage will dominate the distortion when the stimulus voltage is small. It is for this reason that the initial portion of the curve 370 for the combined MTU 315 and CPE splitter 320 is substantially identical to the similar initial portion of the MTU curve 350. As the stimulus voltage increases, there is a point where the signature element with the larger break down voltage will become dominant. This can be the point where, for example, the curve 370 of multiple signature elements begins to deviate from the curve 350 of the single signature element toward a larger distortion. The resulting "bump" can become a signature signal of the case of multiple signature elements.

In the present illustration, because of the separation of the nominal voltage of each individual signature element onset (2.4 and 6.8 volts), it is relatively straightforward to separate the two signature signals. The lower voltage turn-on is evident from the steep ramp up of the third-order distortion as the applied stimulus voltage is raised from approximately one to three volts. The onset of the second, higher voltage signature element is partially obscured by the gently declining distortion contribution from the continued operation of the lower voltage signature element at increasing stimulus levels. Nonetheless, there is a clear slope reversal and ramp up in the combined distortion product, which marks the existence of the higher voltage signature element, from about six to eight volts of applied stimulus.

More complex combinations of signature elements, such as, for example, multiples instances of the same signature element, can be recognized by model matching techniques. Using such a model matching approach, a predetermined library of individual signature elements can be made available, from which possibly redundant combinations of signature elements can be heuristically, and iteratively, selected. The modeled response of each selected library combination can be graded with respect to fit with the measured distortion product versus actual applied stimulus level. The signature signals contained in the best fit model can be subsequently declared present on the subject communication circuit.

Because of the low stimulus frequencies typically involved, and the comparatively high impedance levels typically encountered in the signature elements, twisted pair length is generally a small factor in signature recognition. In the case of very long loops fitted with multiple signature elements, particularly one or more redundant signature elements, a simple T model (e.g., a series resistor, a shunt capacitor, and a series resistor) can be added to the library as an approximate representation of the subscriber loop. Initial values for this simple loop model can be obtained by making a preliminary loop pair to ground (i.e. common mode where, at least virtually, the tip and ring leads are shorted together) capacitance measurement from which loop length, independent of the presence of any conforming signature elements, can be estimated. Then, assuming a mean gauge of wire and capacitance per unit length, approximate resistor and capacitive values for the pair model can be inferred. Additional common mode measurements (all of which are substantially independent of the connected equipment) can be used to determine more precisely the actual gauge, and thus refine the representative model resistance values, if needed to allow for refined signature discrimination.

Figure 2C:
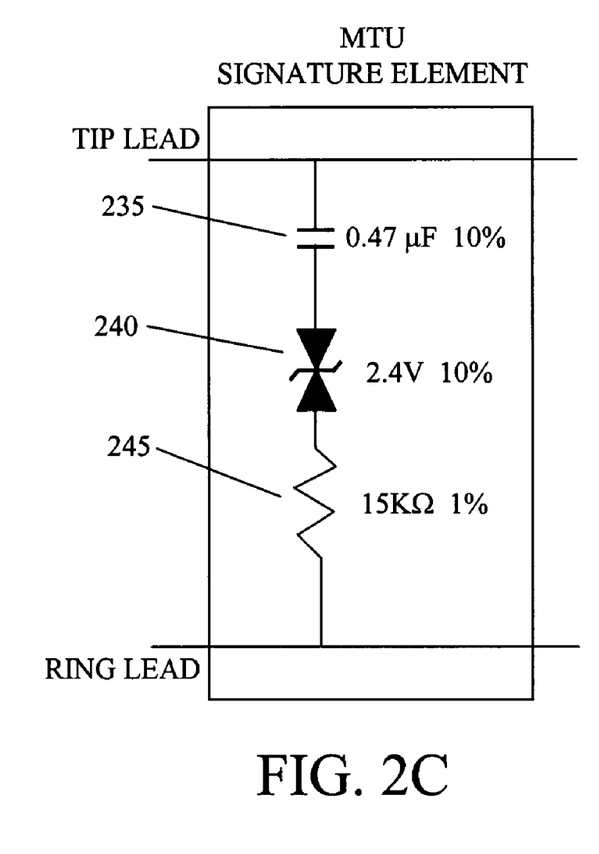

According to exemplary embodiments, different communication circuit devices 115 can include different non-linear and linear signature elements, such as, for example, zener diodes, resistances and the like, and the different communication circuit devices 115 can be present simultaneously. It will be appreciated by those of ordinary skill in the art that the transition stimulus voltage can be utilized to determine the voltage at which a signature element, such as represented in FIG. 2C by the MTU zener diode 240, becomes active, and utilize the broadly-peaked IMD product level to predict the signature loss, such as represented in FIG. 2C by the MTU resistor 245.

According to exemplary embodiments, the stimulus signal generator 105 can be in communication with communication medium 103 of communication circuit 101 using any type of electrical connection capable of communicating electrical information. The evaluation device 110 can be in communication with the stimulus signal generator 105 and the communication medium 103 using any type of electrical connection capable of communicating electrical information. Each of the communication circuit devices 115 can also be in communication with communication medium 103 using any type of electrical connection capable of communicating electrical information. The communication medium 103 can be any suitable type of communication medium capable of communicating electrical information, such as, for example, a twisted pair loop or the like. For example, the communication medium 103 can be a twisted pair subscriber loop or the like.

The stimulus signal generator 105 and evaluation device 110 can be separate devices or components of a single device, such as a unit of testing equipment. The stimulus signal generator 105 and evaluation device 110 can each or collectively be implemented using any suitable electrical or electronic component or device capable of performing the functions associated with the respective element. For example, the stimulus signal generator 105 and evaluation device 110 can include any type of processor, including any type of microprocessor, microcontroller, digital signal processor (DSP), application-specific integrated circuit (ASIC), programmable read-only only memory (PROM), erasable programmable read-only memory (EPROM), electrically-erasable programmable read-only memory (EEPROM), or the like. Additionally, the stimulus signal generator 105 and evaluation device 110 can include any type of computer memory or any other type of electronic storage medium that is located either internally or externally to the processor such as, for example, read-only memory (ROM), random access memory (RAM), cache memory, compact disc read-only memory (CDROM), electro-optical memory, magneto-optical memory, or the like. The processor and memory can be used, for example, to generate or otherwise process the stimulus signals, perform processing on received signature signals, and the like.

Those of ordinary skilled will recognize that the system 100 can include any additional components that can be used for identifying characteristics of communication circuit devices 115 in a communication circuit 101, depending upon the nature and type of the communication circuit 101, the communication circuit devices 115, and the environment in which the system 100 is to be used.

Figure 4:
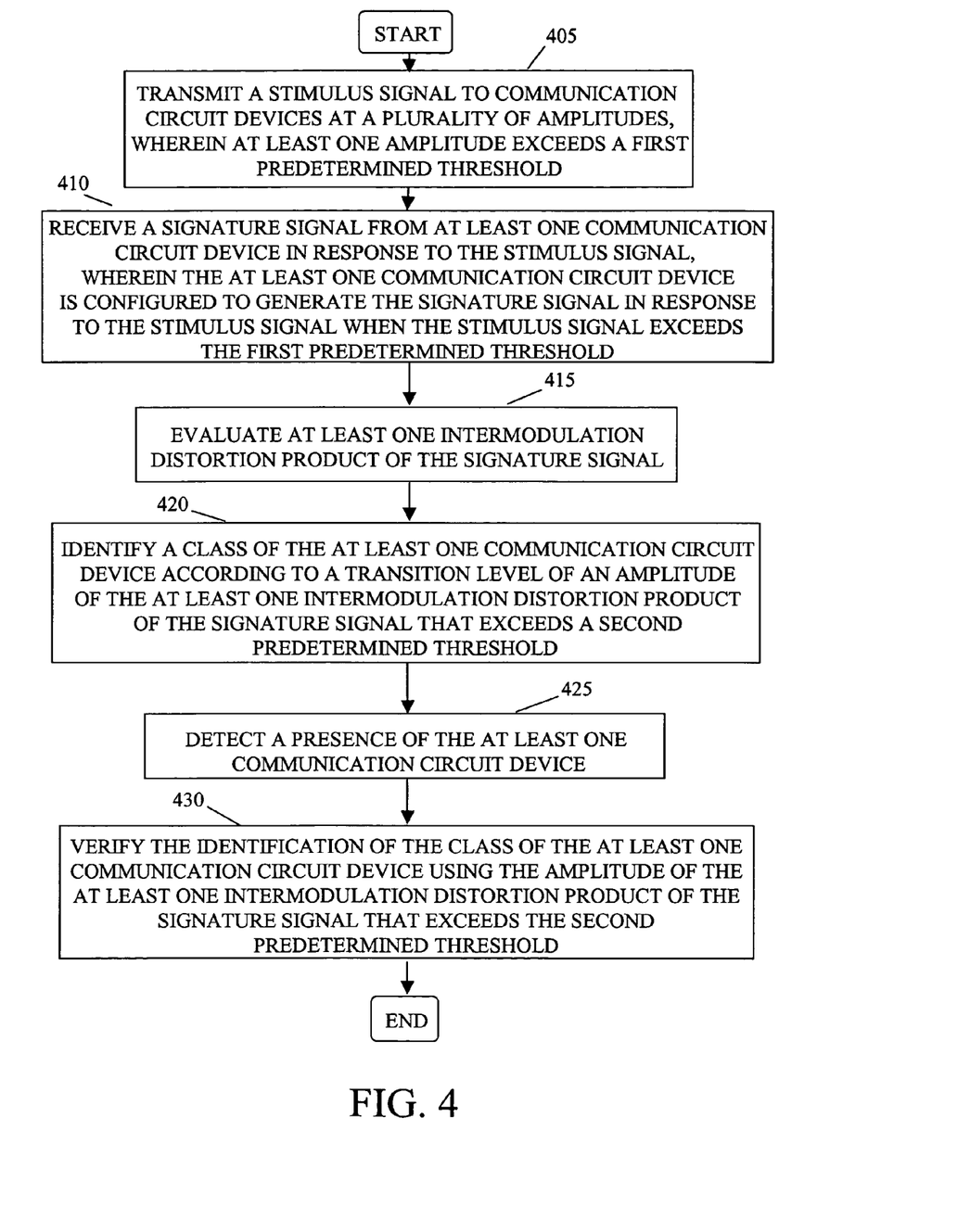
FIG. 4 is a flowchart illustrating steps for identifying characteristics of communication circuit devices in a communication circuit, in accordance with an exemplary embodiment of the present invention.

FIG. 4 is a flowchart illustrating steps for identifying characteristics of communication circuit devices in a communication circuit, in accordance with an exemplary embodiment of the present invention. In step 405, a stimulus signal is transmitted to the communication circuit devices at a plurality of amplitudes. At least one of the plurality of amplitudes exceeds a first predetermined threshold. In step 410, a signature signal is received from at least one communication circuit device in response to the stimulus signal. The at least one communication circuit device is configured to generate the signature signal in response to the stimulus signal when the stimulus signal exceeds the first predetermined threshold. In step 415, at least one intermodulation distortion product of the signature signal is evaluated. In step 420, a class of the at least one communication circuit device is identified according to a transition level of an amplitude of the at least one intermodulation distortion product of the signature signal that exceeds a second predetermined threshold. In step 425, the presence of the at least one communication circuit device is detected. In step 430, the identification of the class of the at least one communication circuit device is verified using the amplitude of the at least one intermodulation distortion product of the signature signal that exceeds the second predetermined threshold.

Figure 5:
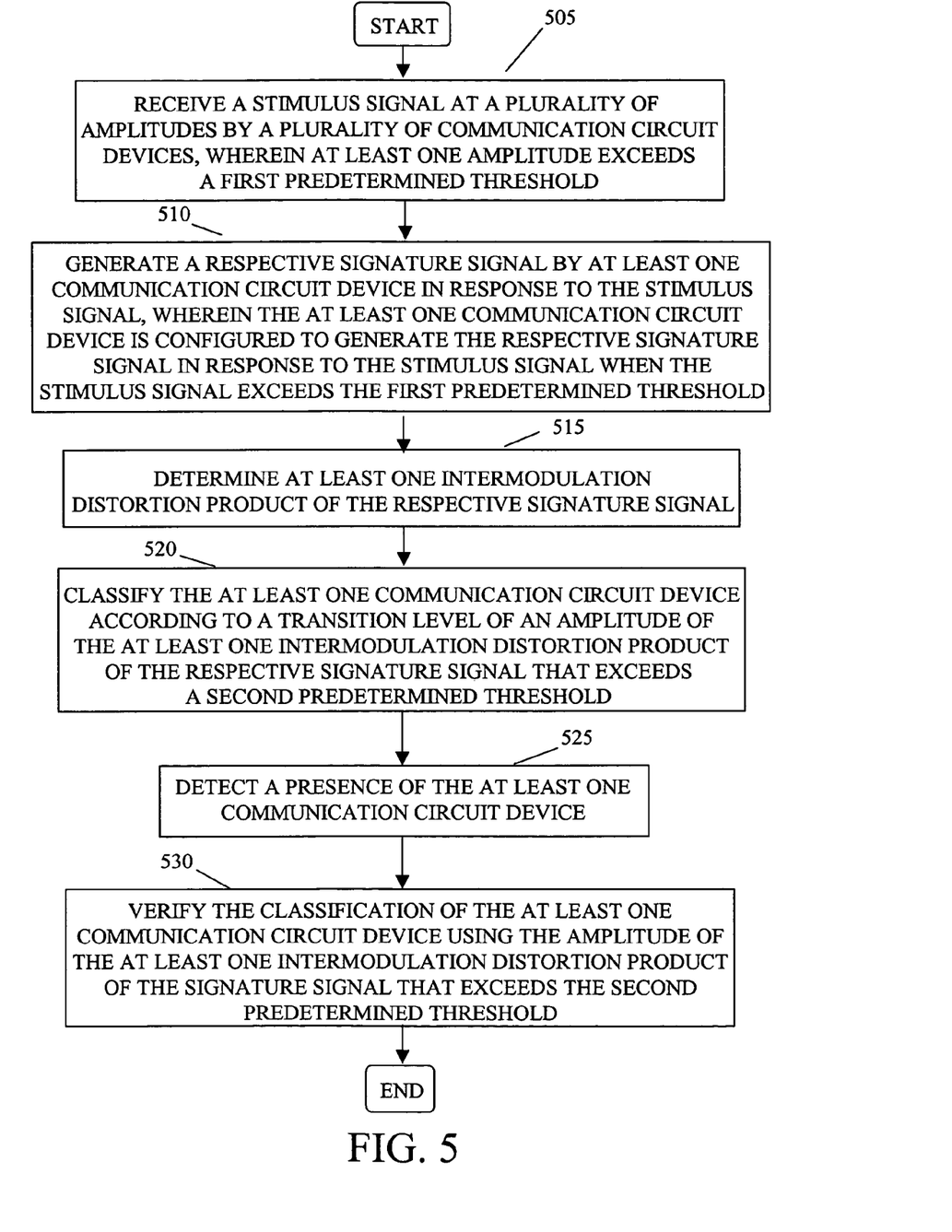
FIG. 5 is a flowchart illustrating steps for evaluating a communication circuit, in accordance with an exemplary embodiment of the present invention.

FIG. 5 is a flowchart illustrating steps for evaluating a communication circuit, in accordance with an exemplary embodiment of the present invention. In step 505, a stimulus signal is received at a plurality of amplitudes by a plurality of communication circuit devices of the communication circuit. At least one of the plurality of amplitudes exceeds a first predetermined threshold. In step 510, a respective signature signal is generated by at least one communication circuit device in response to the stimulus signal. The at least one communication circuit device is configured to generate the respective signature signal in response to the stimulus signal when the stimulus signal exceeds the first predetermined threshold. In step 515, at least one intermodulation distortion product of the respective signature signal is determined. In step 520, the at least one communication circuit device is classified according to a transition level of an amplitude of the at least one intermodulation distortion product of the respective signature signal that exceeds a second predetermined threshold. In step 525, the presence of the at least one communication circuit device is detected. In step 530, the classification of the at least one communication circuit device is verified using the amplitude of the at least one intermodulation distortion product of the respective signature signal that exceeds the second predetermined threshold.

Any or all of the steps of a computer program as illustrated in FIGS. 4 and 5 for identifying characteristics of communication circuit devices in a communication circuit can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a RAM, a ROM, an EPROM or Flash memory, an optical fiber, and a CDROM.

Exemplary embodiments of the present invention can be used in, or in conjunction with, for example, communication testing equipment for testing communication circuits and determining characteristics thereof. Exemplary embodiments of the present invention can be embodied, in whole or in part, in hardware, firmware, any other type of electronic circuitry, software, or any combination thereof.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A system that detects the presence of one or more Customer Premises Equipment (CPE), Maintenance Termination Unit (MTU), or Central Office (CO) devices attached to a copper loop between a Central Office and Customer Premises, the devices being of unknown or unverified class, and identifies by class the devices attached, the system including:
    a test condition generator, adapted to be coupled to a copper loop between a Central Office and Customer Premises, including a signal generator and a test pattern generator, wherein the test pattern generator causes the signal generator to generate
        at least two generated signals of different amplitudes at successive times, and
        the two generated signals are selected to cause one or more devices attached to the copper loop to return intermodulation distortion signatures; and
    a test evaluator, also adapted to be coupled to the copper loop, including a spectrum analyzer and an intermodulation distortion signature analyzer, wherein the intermodulation distortion signature analyzer
        receives from the spectrum analyzer strength readings for at least one intermodulation distortion signal component responsive to each of the generated signals, and
        analyzes a pattern of successive strength readings of the intermodulation distortion signal component, relative to the generated signal amplitudes, to identify by class the one or more devices attached to the copper loop.

2. The system of claim of 1, wherein at the generated signals have amplitudes that straddle a breakdown voltage of a signature element present in at least one particular device attached to the copper loop.

3. The system of claim of 1, wherein the test pattern generator causes the generation of at least two pairs of two signals at successive times, wherein the two pairs differ in frequencies of in the generated signals, thereby producing differing intermodulation distortion signatures from at least some of the devices attached to the copper loop.

4. The system of claim 1, wherein generated signals are selected to include a mix of at least two frequencies.

5. The system of claim 4, wherein the test pattern generator causes the generation of at least two pairs of two signals at successive times, wherein the two pairs differ in what frequencies are mixed in the generated signals, thereby producing differing intermodulation distortion signatures.

6. The system of claim 1, wherein the test evaluator detects presence of the devices attached to the copper loop.

7. The system of claim 1, wherein the test evaluator verifies the class of the devices attached to the copper loop.

8. The system of claim 1, wherein the intermodulation distortion signal component includes a third-order harmonic of at least part of the generated signal.

9. The system of claim 1, further including at least one particular device coupled to the copper loop, wherein the particular device is configured to generate an intermodulation distortion signature having predetermined signal characteristics in response to a particular generated signal.

10. A method to detect the presence of one or more Customer Premises Equipment (CPE), Maintenance Termination Unit (MTU), or Central Office (CO) devices attached to a copper loop between a Central Office and Customer Premises, the devices being of unknown or unverified class, and to identify by class the devices attached, the system including:
    a test pattern generator coupled to a copper loop between a Central Office and Customer Premises generating at least two generated signals of different amplitudes at successive times, wherein the two generated signals cause one or more devices attached to the copper loop to return intermodulation distortion signatures; and
    a test evaluator, also coupled to the copper loop, making strength readings for at least one intermodulation distortion signal component responsive to each of the generated signals, analyzing a pattern of successive strength readings of the intermodulation distortion signal component, relative to the generated signal amplitudes, and identifying by class the devices attached to the copper loop.

11. The method of claim 10, further including the test evaluator detecting presence of the devices attached to the copper loop.

12. The method of claim 10, further including the test evaluator verifying classes of the devices attached to the copper loop.

13. The method of claim 10, further including mixing in the generated signals at least two frequency components.

14. The method of claim 13, further including mixing in the generated signals at least two components of a single frequency with a phase offset.

15. The method of claim 10, further including making strength readings for a third-order harmonic of the intermodulation distortion signature.

16. The method of claim 10, wherein at the generated signals have amplitudes that straddle a breakdown voltage of a signature element present in at least one particular device attached to the copper loop.

* * * * *